United States Patent
Meng et al.

(10) Patent No.: US 6,762,096 B1
(45) Date of Patent: Jul. 13, 2004

(54) METHOD FOR FORMING A POLYSILICON SPACER WITH A VERTICAL PROFILE

(75) Inventors: Fsien-Fu Meng, Taipei (TW); Chyei-Jer Hsieh, Tainan (TW); Yu-Chen Ho, Ban-Chiao (TW); Hsu-Li Cheng, Hsinchu (TW); Ing-Ruey Liaw, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/389,772

(22) Filed: Mar. 18, 2003

(51) Int. Cl.[7] .............................................. H01L 21/336
(52) U.S. Cl. ....................................... 438/267; 438/706
(58) Field of Search .............................. 438/257, 266, 438/267, 680, 689, 692, 706

(56) References Cited

U.S. PATENT DOCUMENTS 5,451,543 A * 9/1995 Woo et al. ................... 438/637
5,756,396 A * 5/1998 Lee et al. .................... 438/622
6,448,649 B1 * 9/2002 Lee et al. .................... 257/758

* cited by examiner

*Primary Examiner*—David Nhu
(74) *Attorney, Agent, or Firm*—Birch, Stewart, Kolasch & Birch, LLP

(57) ABSTRACT

A method of forming a polysilicon spacer with a vertical profile. A dielectric layer and a sacrificial layer are successively deposited to cover the entire surface of a polysilicon layer that covers an insulating structure. Then, CMP is used to remove parts of the sacrificial layer, the dielectric layer and the polysilicon layer to reach a planarized surface. Then, a part of the polysilicon layer outside the insulating structure is removed to make the insulating structures protrude from the top of the polysilicon layer. After removing the sacrificial layer, forming a second oxide layer on the exposed surface of the polysilicon layer and removing the dielectric layer, dry etching is used to remove the polysilicon layer that is not covered by the second oxide layer. The polysilicon layer left under the second oxide layer serves as a polysilicon spacer with a vertical profile.

9 Claims, 4 Drawing Sheets

METHOD FOR FORMING A POLYSILICON SPACER WITH A VERTICAL PROFILE

BACKGROUND OF THE INVENTION

1 Field of the Invention

The invention relates to a method of forming a control gate of a flash memory, and more particularly to a method of forming a polysilicon spacer with a vertical profile.

2 Description of the Related Art

A flash memory cell comprises a floating gate for storing charges and a control gate for controlling the voltage of a world line, in which the voltages of the world line and source/drain electrodes are coordinated to control the charge-stored capacity of the floating gate and decide the on/off state of a transistor. Thus, the flash memory is also called an erasable programmable read only memory, or EPROM. For early flash memory devices, a gate structure is formed by stacking the control gate on the floating gate. As for the recent flash memory device, a gate structure is formed by laterally arranging the control gate and the floating gate, in which a polysilicon spacer is formed on the sidewall of the floating gate to serve as a control gate.

FIGS. 1A and 1B are cross-sections showing a conventional method of forming a control gate. In FIG. 1A, a semiconductor silicon substrate 10 is provided with two floating gates 12A and 12B embedded in a insulating structure 14, and a source polysilicon layer 16 formed in the insulating structure 14 between the two floating gates 12A and 12B. Then, a polysilicon layer 18 is deposited on the entire surface of the semiconductor silicon substrate 10. Next, in FIG. 1B, using an etching back process, the polysilicon layer 18 is removed from the top of the insulating structure 14 and the source polysilicon layer 16, and the polysilicon layer 18 left on the outer sidewalls of the floating gates 12A and 12B becomes two polysilicon spacers 19, respectively. Therefore, each of the polysilicon spacers 19 serves as a control gate pattern.

Since the polysilicon layer 18 has a deposited surface with an undulating profile depending on the topography of the semiconductor silicon substrate 10, this limitation causes the polysilicon spacer 19 to have an arc-shaped profile by the conventional etching back process. The polysilicon spacer 19 fails to form a control gate pattern with a vertical profile, and the arc-shaped profile can not conform to requests in sequential processes.

SUMMARY OF THE INVENTION

Accordingly, an object of the invention is to provide a method of forming a polysilicon spacer with a vertical profile to serve as a control gate of a flash memory.

To achieve these and other advantages, the invention provides a method of forming a polysilicon spacer with a vertical profile. A dielectric layer and a sacrificial layer are successively deposited to cover the entire surface of a polysilicon layer that covers an insulating structure. Then, CMP is used to remove parts of the sacrificial layer, the dielectric layer and the polysilicon layer to reach a planarized surface. Then, a part of the polysilicon layer outside the insulating structure is removed to make the insulating structures protrude from the top of the polysilicon layer. After removing the sacrificial layer, forming a second oxide layer on the exposed surface of the polysilicon layer and removing the dielectric layer, dry etching is used to remove the polysilicon layer that is not covered by the second oxide layer. The polysilicon layer left under the second oxide layer serves as a polysilicon spacer with a vertical profile.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

For a better understanding of the present invention, reference is made to a detailed description to be read in conjunction with the accompanying, which are given by way of illustration only, and thus are not limitative of the present invention, and in which.

DETAILED DESCRIPTION OF THE INVENTION

A preferred embodiment of the present invention is now described with reference to FIGS. 2A through 2I.

Figure 1A:
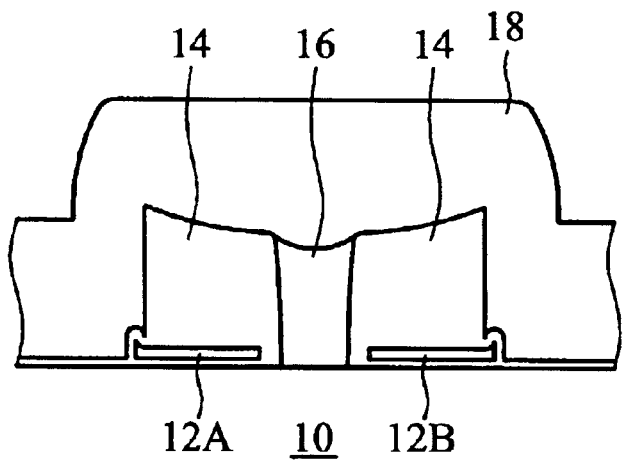
FIGS. 1A and 1B are cross-sections showing a conventional method of forming a control gate.
Figure 1B:
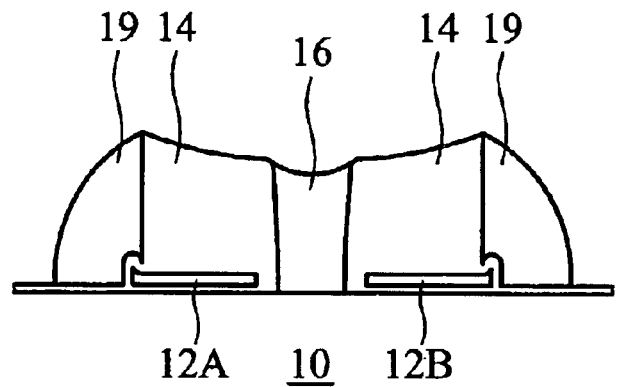
Figure 2A:
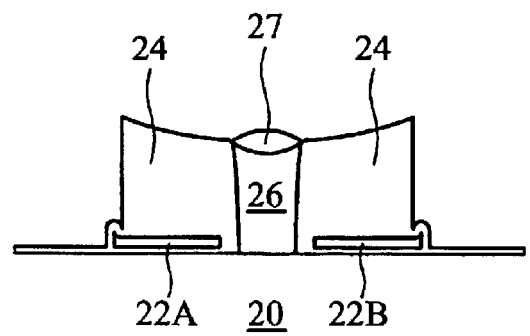
FIGS. 2A to 2I are cross-sections showing a method of forming a polysilicon spacer with a vertical profile according to the present invention.

FIGS. 2A to 2I are cross-sections showing a method of forming a polysilicon spacer with a vertical profile according to the present invention. In FIG. 2A, a semiconductor silicon substrate 20 is provided with a first floating gates 22A and a second floating gate 22B embedded in a insulating structure 24, a source polysilicon layer 26 formed in the insulating structure 24 between the two floating gates 22A and 22B, and a first oxide layer 27 formed on the top of the source polysilicon layer 26.

Figure 2B:
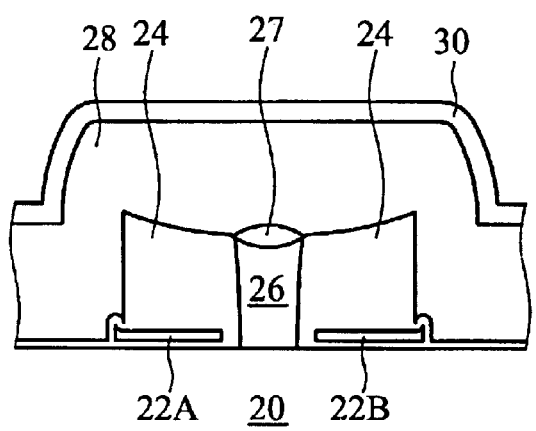
Figure 2C:
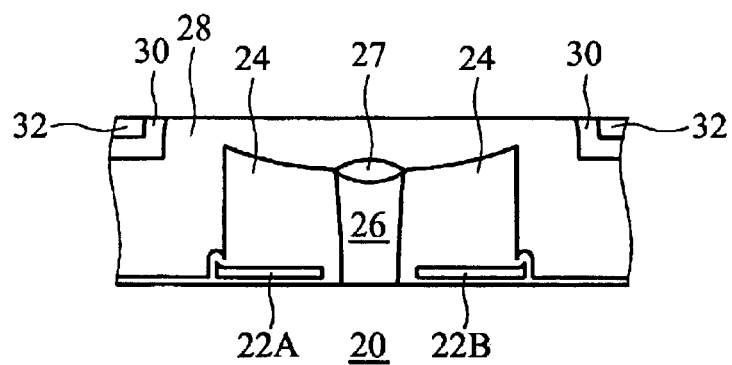
Figure 2D:
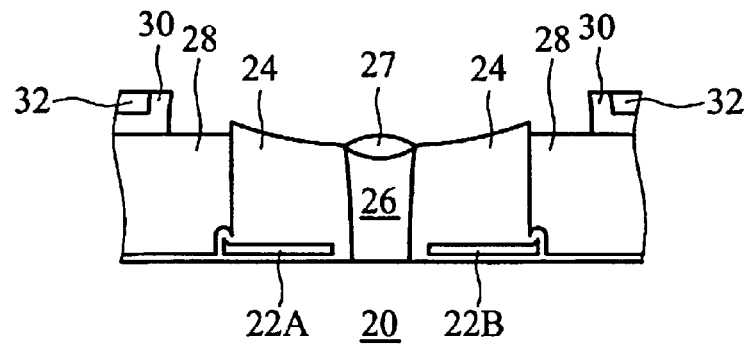
Figure 2E:
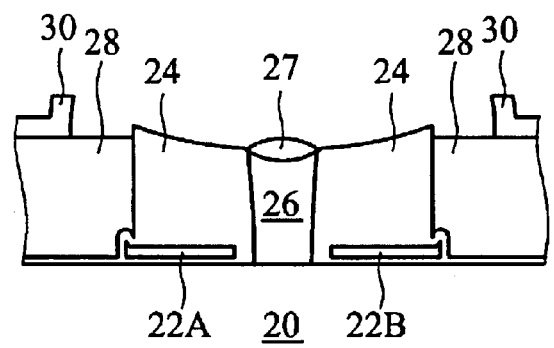
Figure 2F:
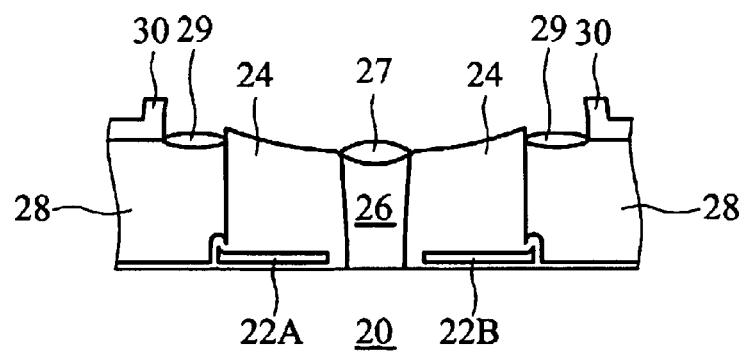

Then, in FIG. 2B, a polysilicon layer 28 and a dielectric layer 30 are successively deposited on the entire surface of the semiconductor silicon substrate 20. Preferably, the dielectric layer 30 is silicon nitride (SiN). Next, in FIG. 2C, a sacrificial layer 32 is deposited on the dielectric layer 30, and then chemical mechanical polishing (CMP) is used to remove parts of the sacrificial layer 32, the dielectric layer 30 and the polysilicon layer 28 until a predetermined planarization is reached. Preferably, the sacrificial layer 32 is photoresist, spin-on glass (SOG), Borophosphosilicate glass (BPSG), borosilicate glass (BSG), bottom anti-reflective coating (BARC) or TEOS-oxide. Next, in FIG. 2D, using photolithography with a photo mask, the polysilicon layer 28 that is left on the top of the first oxide layer 27 and the insulating structure 24 is completely removed. Also, the polysilicon layer 28 within a predetermined area of the control gates is removed to reach a predetermined height, resulting in the insulating structure 24 being protruded from the polysilicon layer 28. Then, in FIG. 2E, the sacrificial layer 32 left on the dielectric layer 30 is completely removed. Next, in FIG. 2F, using thermal oxidation, a second oxide layer 29 is grown on the exposed surface of the polysilicon layer 28.

Figure 2G:
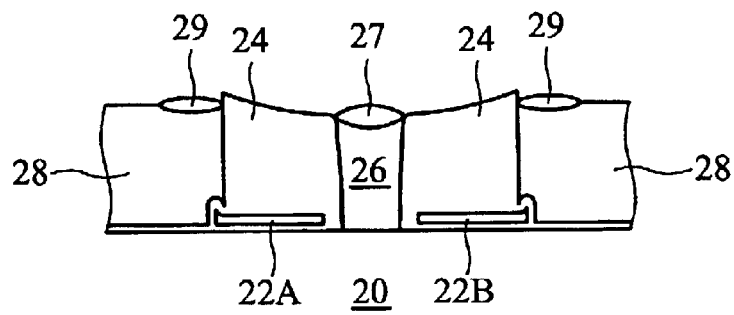
Figure 2H:
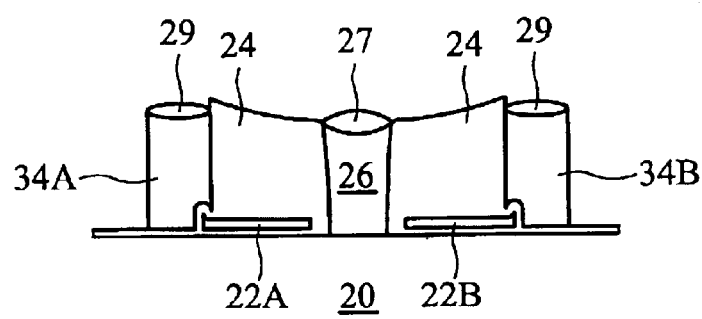
Figure 2I:
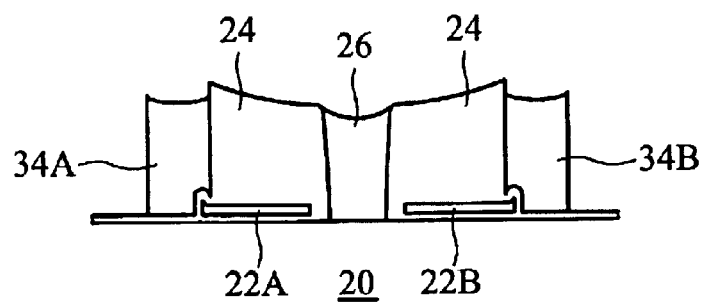

Thereafter, in FIG. 2G, the dielectric layer 30 left on the polysilicon layer 28 is completely removed. Next, in FIG. 2H, using photolithography and dry etching with a photo mask, the polysilicon layer 28 outside the second oxide layer 29 is removed. Therefore, the polysilicon layer 28 under the second oxide layer 29 is patterned as a first polysilicon spacer 34A and a second polysilicon spacer 34B to serve as two control gates. Finally, in FIG. 2I, the first oxide layer 27 and the second oxide layer 29 are completely removed to expose the top of the source polysilicon layer 26 and the tops of the two polysilicon spacers 34A and 34B. This completes the control gate of the present invention, and sequential processes related to flash memory manufacture can proceed on the above-described structure shown in FIG. 2I.

Compared with prior art that directly etches back a polysilicon layer to form a control gate with an arc-shaped profile, the present invention provides a planarized surface by depositing the dielectric layer 30 and the sacrificial layer 32 and using CMP thereon prior to the dry etching process on the polysilicon layer 28. Therefore, each of the first polysilicon spacer 34A and the second polysilicon spacer 34B has a vertical profile to fit in with requests in sequential processes related to flash memory manufacture.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a polysilicon spacer with a vertical profile, comprising the steps of:

providing a semiconductor silicon substrate on which a source polysilicon layer is sandwiched between two adjacent insulating structures, and a first oxide layer is formed on the source polysilicon layer;

forming a polysilicon layer to completely cover the semiconductor silicon substrate;

forming a dielectric layer to completely cover the polysilicon layer;

forming a sacrificial layer to completely cover the dielectric layer;

removing parts of the sacrificial layer, the dielectric layer and the polysilicon layer to reach a planarized surface;

removing a part of the polysilicon layer which covers the first oxide layer and the insulating structures;

removing a part of the polysilicon layer which is outside the insulating structures to make the insulating structures protrude from the top of the polysilicon layer;

removing the sacrificial layer;

forming a second oxide layer on the polysilicon layer;

removing the dielectric layer; and removing the polysilicon layer that is not covered by the second oxide layer, wherein the polysilicon layer left under the second oxide layer serves as a polysilicon spacer with a vertical profile.

2. The method of forming a polysilicon spacer with a vertical profile as claimed in claim 1, wherein the semiconductor silicon substrate comprises two floating gates embedded in the two insulating structures, respectively.

3. The method of forming a polysilicon spacer with a vertical profile as claimed in claim 1, wherein the dielectric layer is silicon nitride.

4. The method of forming a polysilicon spacer with a vertical profile as claimed in claim 1, wherein the sacrificial layer is photoresist, spin-on glass (SOG), Borophosphosilicate glass (BPSG), borosilicate glass (BSG), bottom anti-reflective coating (BARC) or TEOS-oxide.

5. The method of forming a polysilicon spacer with a vertical profile as claimed in claim 1, wherein the step of removing parts of the sacrificial layer, the dielectric layer and the polysilicon layer to reach a planarized surface employs a chemical mechanical polishing (CMP) method.

6. The method of forming a polysilicon spacer with a vertical profile as claimed in claim 1, wherein the polysilicon spacer with a vertical profile serves as a control gate with a vertical profile.

7. The method of forming a polysilicon spacer with a vertical profile as claimed in claim 1, further comprising:

removing the first oxide layer and the second oxide layer to expose the source polysilicon layer and the polysilicon spacer.

8. The method of forming a polysilicon spacer with a vertical profile as claimed in claim 1, wherein the step of removing the polysilicon layer not covered by the second oxide layer employs a dry etching process.

9. The method of forming a polysilicon spacer with a vertical profile as claimed in claim 1, wherein the method of forming a polysilicon spacer with a vertical profile is applied to a process of forming a control gate of a flash memory.

* * * * *